(12) United States Patent
Aoki et al.

(10) Patent No.: US 7,215,232 B2
(45) Date of Patent: May 8, 2007

(54) SURFACE MOUNT COIL COMPONENT AND SURFACE MOUNT COIL COMPONENT MOUNTED SUBSTRATE

(75) Inventors: Hidenori Aoki, Gunma (JP); Kouichirou Wada, Gunma (JP); Hideki Ogawa, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 9 days.

(21) Appl. No.: 11/241,276

(22) Filed: Sep. 30, 2005

(65) Prior Publication Data

US 2006/0071749 A1   Apr. 6, 2006

(30) Foreign Application Priority Data

Sep. 30, 2004   (JP) .............. 2004-288135

(51) Int. Cl.
*H01F 27/02* (2006.01)

(52) U.S. Cl. ..................... 336/83
(58) Field of Classification Search .............. 336/83
See application file for complete search history.

(56) References Cited

U.S. PATENT DOCUMENTS 6,535,095 B2 * 3/2003 Aoki et al. .............. 336/83
6,577,218 B2 * 6/2003 Hamatani et al. .......... 336/83
6,825,746 B2 * 11/2004 Otsuka et al. ............ 336/83
2003/0218526 A1 * 11/2003 Fan ....................... 336/83

FOREIGN PATENT DOCUMENTS

JP   58-124213   7/1983
JP   2000-306757   11/2000

* cited by examiner

*Primary Examiner*—Elvin Enad
*Assistant Examiner*—Joselito Baisa
(74) *Attorney, Agent, or Firm*—Knobbe Martens Olson & Bear LLP (57) ABSTRACT

A surface mount coil component has an electrode part including: internal electrodes mounted on both flanges of a drum type core over bottom surfaces and wraparound portions extending from the bottom surfaces to the end surfaces and parts of both sides. The coil conductor is conductively joined to the internal electrodes at both ends thereof. Intermediate electrodes cover from the top sides of wraparound portions of the internal electrodes on the sides of the flanges through top sides of the wraparound portion thereof on the end surfaces of the flanges to top sides of the wraparound portion thereof on the other sides of the flanges so as to leave C-shaped cross section of exposed areas of the internal electrodes. Also, plating conductive films extend from surfaces of the exposed areas of the internal electrodes to surfaces of the intermediate electrodes.

8 Claims, 6 Drawing Sheets

SURFACE MOUNT COIL COMPONENT AND SURFACE MOUNT COIL COMPONENT MOUNTED SUBSTRATE

BACKGROUND OF THE INVENTION

1. Field of the Invention

The present invention relates to a technical field of a surface mount coil component and the surface mount coil component mounted substrate being substantially rectangular parallelepiped shape in appearance and having an electrode structure formed directly on a core.

2. Description of Related Art

Figure 4:
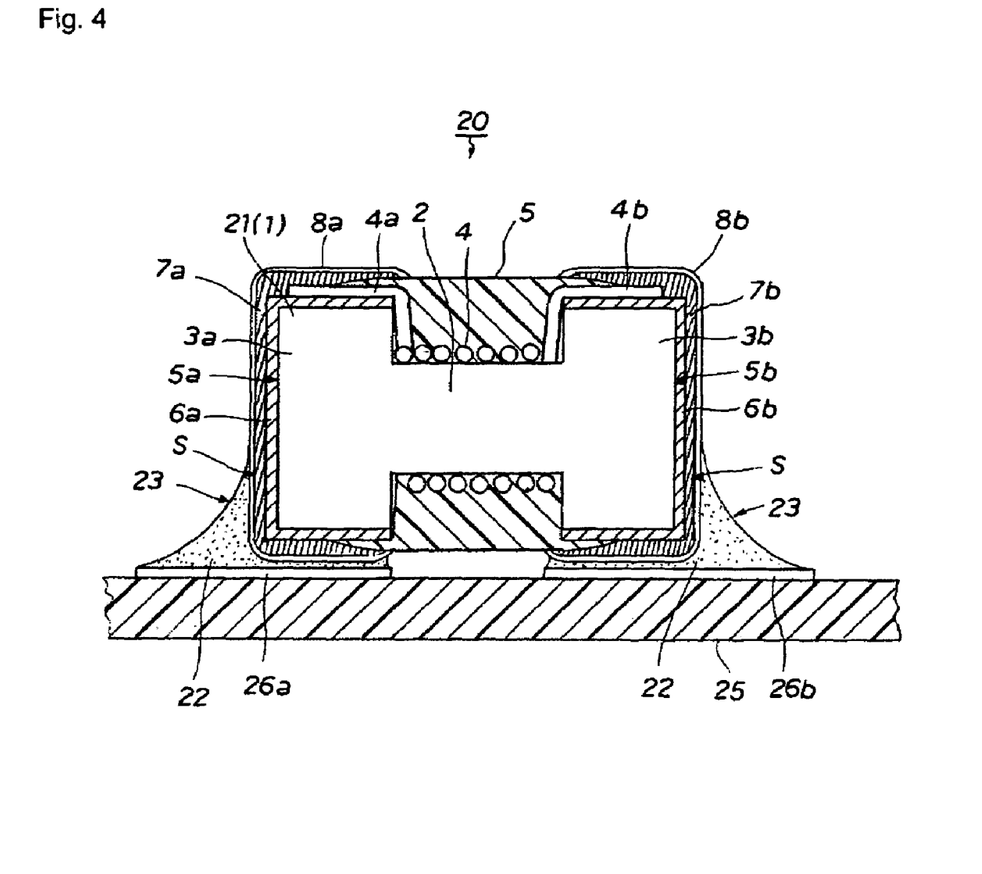
FIG. 4 is a cross-sectional view showing a structure of a surface mount coil component in the related art.

The surface mount coil component has a substantially rectangular parallelepiped shape (chip-shaped) in product appearance as shown in a sectional view in FIG. 4, and includes an electrode structure formed directly on both ends of a pillar-shaped core 21 having a substantially rectangular cross section at least at both ends (typically, a drum type core 1 having flanges 3a, 3b having a substantially rectangular cross section at both ends of a winding core part 2). The surface mount coil component 20 such as a choke coil in which cover resin 5 is molded on a coil part of a winding coil 4 wound on the winding core part 2 is suitable for automatic mounting, and is fixedly mounted to electrode pads 26a, 26b of a mounting substrate 25 (printed circuit board) by reflow soldering.

Focusing on the electrode structure of the surface mount coil component 20 in the related art, mentioned above, it typically has an electrode structure (two-terminal) such that internal electrodes 6a, 6b are formed directly on a pillar-shaped core 21 having a rectangular cross section so as to cover end surfaces 5a, 5b at both ends. The electrodes extend perpendicularly to a core axis and wrap around four peripheral surfaces which surround the end surfaces 5a, 5b (over bottom surfaces, the upper surfaces, and side surfaces of the flanges 3a, 3b of the drum type core 1) like a lid. End portions 4a, 4b of a winding coil 4 are connected to the internal electrodes, and cover resin 5 is molded, then, intermediate electrodes 7a, 7b are formed, and finally external electrodes 8a, 8b of plating conductive films are formed so as to cover the entire intermediate electrodes 7a, 7b.

Since the electrode structure of this configuration includes the external electrodes 8a, 8b extending widely from the end surfaces 5a, 5b to the four peripheral surfaces adjacent thereto, respectively, this structure is referred to as five-surface electrode structure, hereinafter.

The surface mount coil component 20 is soldered at bottom side portions (one surface) of the external electrodes 8a, 8b thereof to a mounting substrate 25 by solder 22, and is conductively fixed with built-up solder (solder fillets 23) from the electrode parts 26a, 26b of the mounting substrate 25 formed on end sides or lateral sides of the external electrodes 8a, 8b.

Figure 5:
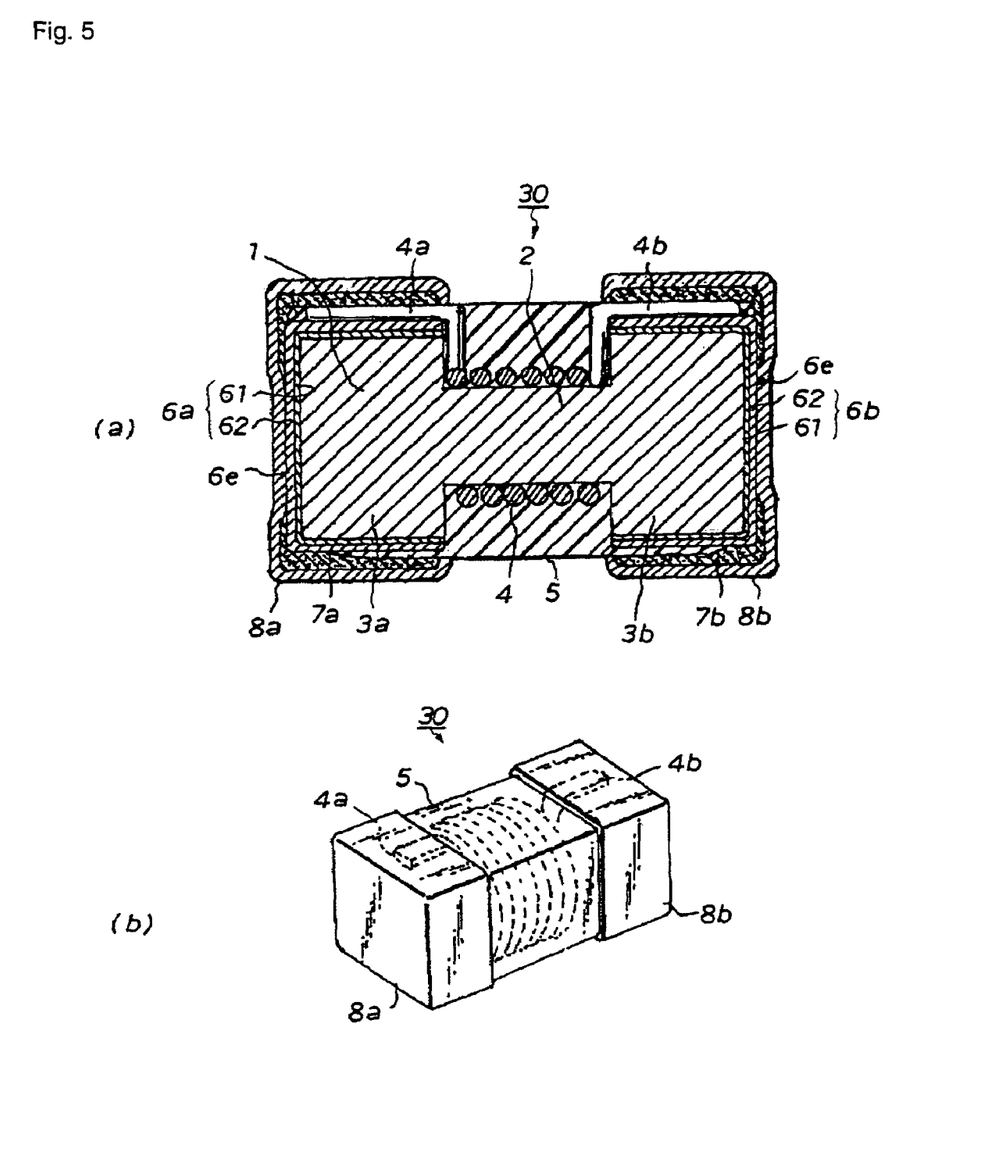
FIG. 5A is a cross-sectional view of a coil component disclosed in JP-A-2000-306757.
FIG. 5B is a perspective diagram of the coil component disclosed in JP-A-2000-306757.

As a publicly known document relating to an electrode structure of a surface mount coil component, JP-A-2000-306757 discloses a coil component 30 having an electrode structure in which connection reliability is improved by providing lid-shaped internal electrodes 6a, 6b (each including a ground layer 61 and an upper layer 62) formed so as to cover four peripheral surfaces and end surfaces of square-shaped flanges 3a, 3b at both ends of a drum type core 1, connecting end portions 4a, 4b of a winding coil 4 wound on a winding core part 2 to the internal electrodes (upper sides of the flanges 3a, 3b in FIG. 5), molding the cover resin 5, providing intermediate electrodes 7a, 7b on the internal electrode 6 except for parts (non-formation parts 6e of the intermediate electrodes) on the end sides thereof, and then providing external electrodes 8a, 8b from the surfaces of the intermediate electrodes 7a, 7b to surfaces of the non-formation parts 6e of the intermediate electrodes over five surfaces.

Figure 6:
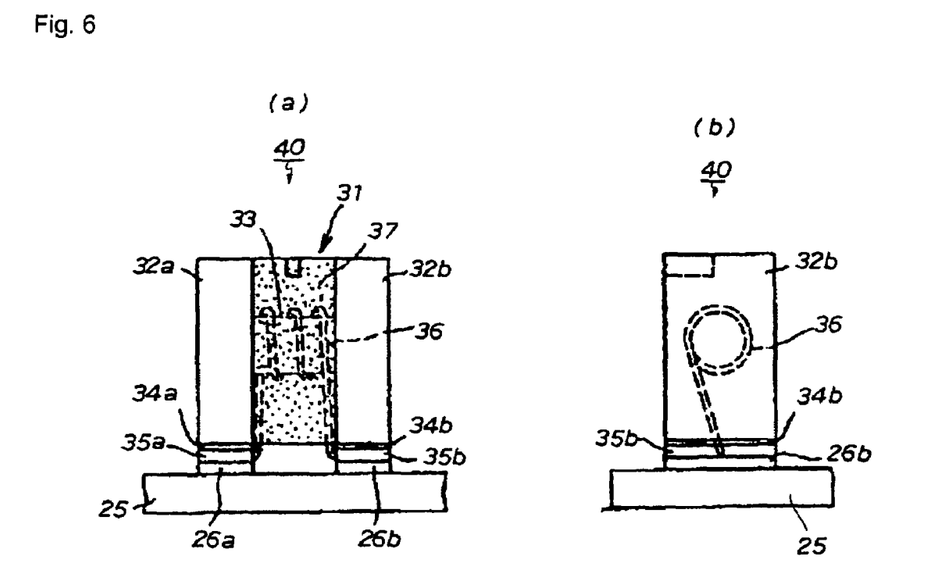
FIG. 6A is a side-view of a coil component disclosed in JP-A-58-124213.
FIG. 6B is a front elevation of the coil component disclosed in JP-A-58-124213.

Also, as another publicly known document relating to a coil component of one-surface electrode structure in which the external electrode is formed substantially on one surface (a surface of a side to be soldered to the mounting substrate), JP-A-58-124213 discloses a surface mount coil component 40 as shown in a side-view in FIG. 6A, and in a front elevation in FIG. 6B as a "chip-type variable inductance device". In the third line of an upper right column in page 2 to the fourth line in a lower left column in the same page, a mounting method of the electrode structure to the mounting substrate is described. In other words, the chip-type variable inductance device 40 shown in FIG. 6 includes (external) electrodes 35a, 35b laminated on lower surfaces of insulating layers 34a, 34b provided on bottom sides of flanges 32a, 32b, and both ends of a coil 36 is connected respectively to the (external) electrodes 35a, 35b. Then, in this structure, the (external) electrodes 35a, 35b are to be soldered to predetermined patterns (electrode pads 26a, 26b) on the mounting substrate (printed circuit board) 25.

In the surface mount coil component, the electrode surface area is preferably reduced as much as possible to ensure close adhesion with respect to a mounting substrate (the surfaces on the bottom sides of the flanges) in terms of improvement of quality factor characteristics, which is a ratio between the reactance X and the resistance R. Therefore, securing a large surface area of the external electrodes on the flanges of the drum type core, which is generally employed in the surface mount coil component over five surfaces causes variations in magnetic field in the core interior, and eddy current in an area close to the electrode surfaces, thereby lowering the quality factor characteristics as the inductor.

On the other hand, in the case of the surface mount coil components 20, 30 in the related art described above, in the sight of the electrode structure and the mounting strength, since the cohesion strength between the internal electrodes 6a, 6b formed directly on the core which are generally formed of Ag electrodes (formed by printing silver paste containing glass frit) and the intermediate electrodes 7a, 7b formed generally of resin Ag electrode (formed by printing conductive paste containing hardening type resin and dried) is low, if the surface areas of the external electrodes 8a, 8b are small, electrode peel may occur at an interface between them (in particular, at an interface S near the solder fillets 23 in FIG. 4) when an impact or a load is applied after the substrate is mounted, thereby lowering the mounting strength. In other words, reduction of the electrode surface area for improving the quality factor characteristics (employment of single-surface electrode structure) tends to cause electrode peel because of lower mounting strength.

In this regard, since the electrode structure in the surface mount coil components 20, 30 in the related art employ the electrode structure in which the end surfaces and the upper, lower, left and right four peripheral surfaces of the flanges 3a, 3b of the drum type core 1 are entirely covered by the internal electrodes 6a, 6b, the intermediate electrodes 7a, 7b, and the external electrodes 8a, 8b (five-surface electrode structure), a large cohesion area is secured. Therefore, even though the cohesion strength is low, it is compensated by the size of cohesion area. Consequently, at least the standard mounting strength is achieved.

The electrode structure of the surface mount coil component 40 in the related art is low in cohesion strength with respect to the external electrodes, and hence improvement of the cohesion strength is desired.

Therefore, it will be important to reduce the electrode surface area to improve the quality factor characteristics of the surface mount coil, and simultaneously to increase the cohesion strength with respect to the external electrodes.

SUMMARY OF THE INVENTION

In view of such circumstances, it is an object of the invention to provide a surface mount coil component having a single-surface electrode structure which can prevent electrode parts from being peeled off easily by an impact after soldering to the mounting substrate and can achieve high cohesion strength with respect to the external electrode, thereby realizing improvement of mounting reliability.

It is another object of the invention to provide a substrate on which the superior surface mount coil component is mounted, and to provide a substrate being superior in cohesive property at the interface and in durability whereby the electrode part is prevented from being peeled off due to an impact or a load since the conductive film serving as the external electrode is adhered to the solder fillet.

The invention solves the above-described problems in the following manners.

(1) The above-described problems are solved by providing a surface mount coil component including: internal electrodes respectively formed directly on a core near both ends thereof from bottom surfaces to wraparound portions which extend at least from the bottom surfaces to end surfaces and parts of both sides; intermediate electrodes extending from top sides of the wraparound portions of the internal electrodes on one side through the top sides of the wraparound portions of the internal electrodes on the end surfaces to the top sides of the wraparound portions of the internal electrodes on the other side for covering the internal electrodes of the bottom surfaces; exposed areas on side surfaces of the internal electrodes being exposed from the intermediate electrodes; and conductive films continuing from surfaces of the exposed areas of the internal electrodes to surfaces of the intermediate electrodes.

(2) The above-described problems are solved by providing the surface mount coil component according to (1) wherein the core is a pillar shaped core.

(3) The above-described problems are solved by providing the surface mount coil component according to (1), wherein the core is a drum type core, and including: internal electrodes mounted directly on bottom surfaces at both flanges of the drum type core and wraparound portions extending from the bottom surfaces to end surfaces and parts of both sides, respectively; coil conductor wound around a winding core part of the drum type core; the coil conductor being conductively joined to the internal electrodes at the ends thereof; intermediate electrodes extending from top sides of the wraparound portions of the internal electrodes to the sides of the flanges through the top sides of the wraparound portions of the internal electrodes to the end surfaces of the flanges to the top sides of the wraparound portions of the internal electrodes to the other sides of the flanges for covering the internal electrodes of the bottom surfaces; exposed areas of the internal electrodes being exposed from the intermediate electrodes on their sides, and conductive films continuing from surfaces of the exposed areas on side surfaces of the internal electrodes to surfaces of the intermediate electrodes.

(4) The above-described problems are solved by providing the surface mount coil component according to (1), wherein the conductive film is a plating film.

(5) The above-described problems are solved by providing a surface mount coil component mounted substrate including a substrate and a surface mount coil component disposed on the substrate, the surface mount coil component including: internal electrodes respectively formed directly on a core near both ends thereof from bottom surfaces to wraparound portions which extend at least from the bottom surfaces to end surfaces and parts of both sides; intermediate electrodes extending from top sides of the wraparound portions of the internal electrodes on one side through the top sides of the wraparound portions of the internal electrodes on the end surfaces to the top sides of the wraparound portions of the internal electrodes on the other side for covering the internal electrodes of the bottom surfaces; exposed areas on side surfaces of the internal electrodes being exposed from the intermediate electrodes on their sides; and conductive films continuing from surfaces of the exposed areas of the internal electrodes to surfaces of the intermediate electrodes.

(6) The above-described problems are solved by providing the surface mount coil component mounted substrate according to (5) including the surface mount coil component wherein the core is a pillar-shaped core.

(7) The above-described problems are solved by providing the surface mount coil component mounted substrate according to (5), wherein the core is a drum type core and the surface mount coil component includes: internal electrodes mounted directly on bottom surfaces at both flanges of the drum type core and wraparound portions extending from the bottom surfaces to end surfaces and parts of both sides, respectively; coil conductor wound around a winding core part of the drum type core; the coil conductor being conductively joined to the internal electrodes at the ends thereof; intermediate electrodes extending from top sides of the wraparound portions of the internal electrodes to the sides of the flanges through the top sides of the wraparound portions of the internal electrodes to the end surfaces of the flanges to the top sides of the wraparound portions of the internal electrodes to the other sides of the flanges for covering the internal electrodes of the bottom surfaces; exposed areas of the internal electrodes being exposed from the intermediate electrodes on their sides, and conductive films continuing from surfaces of the exposed areas on side surfaces of the internal electrodes to surfaces of the intermediate electrodes.

(8) The above-described problems are solved by providing the surface mount coil component mounted substrate according to (5), wherein the conductive film is a plating film.

According to the surface mount coil component of the invention, since it is the single-surface electrode structure, the quality factor characteristics are improved.

According to the surface mount coil component of the invention, since the internal electrodes and the external electrodes (the plating conductive films) are in close contact with each other at the exposed areas, the cohesion strength of the external electrode is increased, and the mounting strength against the impact or the load applied after the component is mounted is improved.

The surface mount coil component mounted substrate according to the invention is:
(a) superior in quality factor characteristics and adhesion characteristics since the surface mount coil component having superior characteristics is disposed.
(b) high in cohesion strength between the solder fillet and the external electrode, and hence superior in cohesion property between the component and the substrate.

DESCRIPTION OF CERTAIN EMBODIMENTS

Referring now to the drawings, embodiments of a surface mount coil component will be described. Members of the same material are represented by the same reference numerals and description will be omitted.

Figure 1:
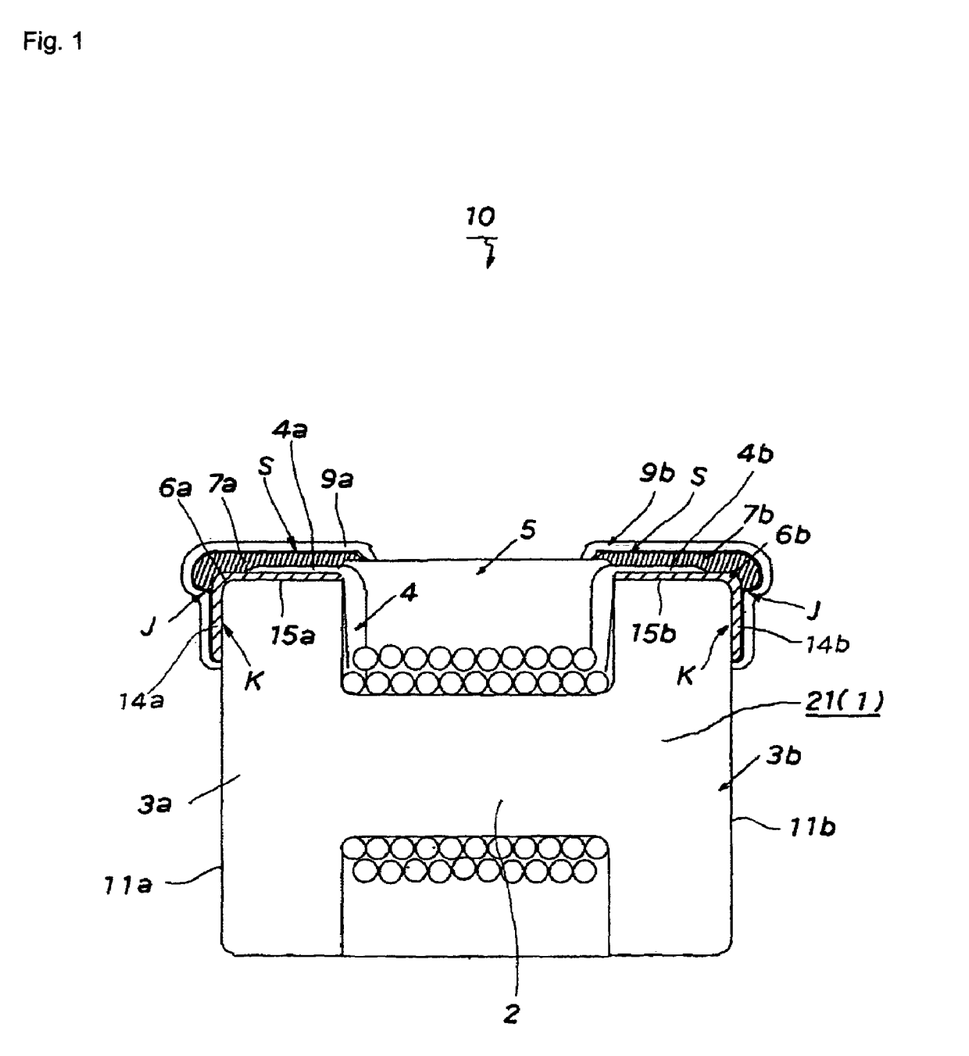
FIG. 1 is a cross-sectional view showing a structure of a surface mount coil component.
Figure 2:
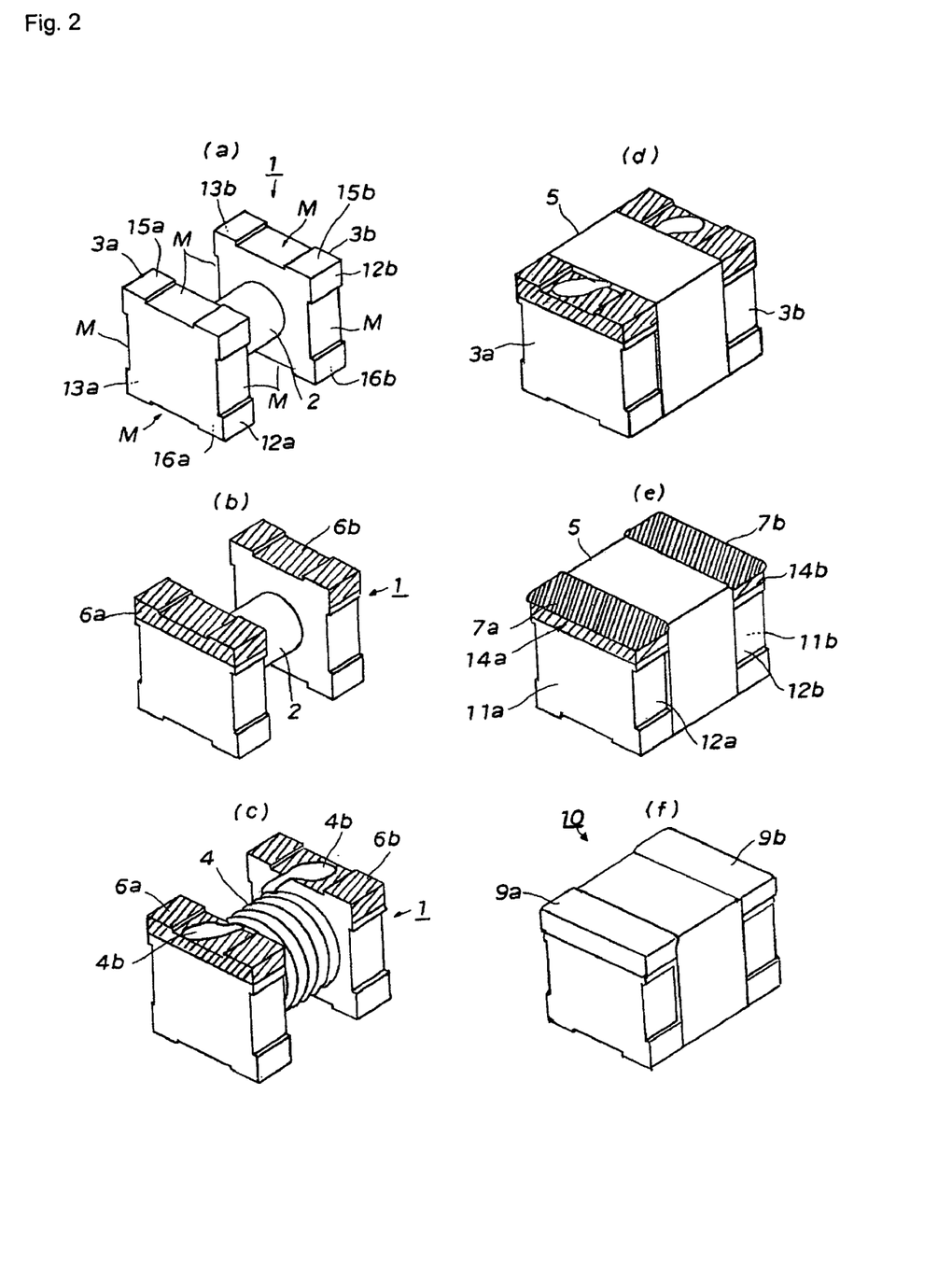
FIG. 2 is a diagram illustrating a surface mount coil at various stages of a manufacturing process.
Figure 3:
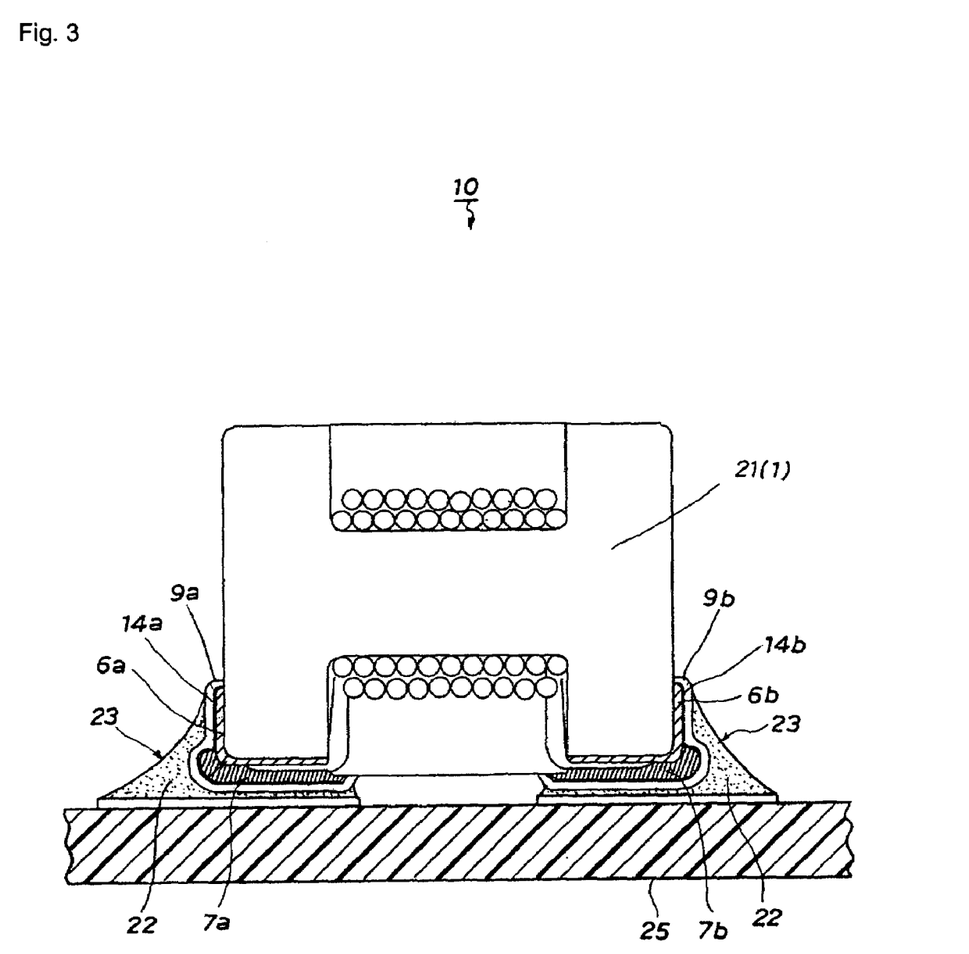
FIG. 3 is a cross-sectional view showing a mounting substrate of the surface mount coil component.

FIG. 1 is a cross-sectional view showing a structure of the surface mount coil component according to an embodiment in a state of being inverted so that a bottom surface faces upward. FIG. 2 is a diagram illustrating a coil at various stages of a manufacturing process. FIG. 3 is a cross-sectional view showing a mounting substrate of the surface mount coil component The surface mount coil component 10 shown in FIG. 1 has an electric structure which includes internal electrodes 6a, 6b directly mounted to a pillar-shaped core 21(1) near both ends thereof from bottom surfaces 15a, 15b to wraparound portions K which extend at least from the bottom surfaces 15a, 15b to end surfaces 11a, 11b and parts of both sides (12a, 12b, 13a, 13b in FIG. 2); intermediate electrodes 7a, 7b extending from top sides J of the wraparound portions of the internal electrodes 6a, 6b on one side at the both ends of the pillar-shaped core (12a, 12b in FIG. 2) through the top sides J of the wraparound portions of the internal electrodes 6a, 6b on the end surfaces 11a, 11b at both ends of the pillar-shaped core to the top sides J of the wraparound portions of the internal electrodes 6a, 6b on the other side (13a, 13b in FIG. 2) at both ends of the pillar-shaped core 21(1) for covering the internal electrodes 6a, 6b of the bottom surfaces 15a, 15b; exposed areas 14a, 14b on side surfaces of the internal electrodes being exposed from the intermediate electrode; and plating conductive films 9a, 9b continuing from the surfaces of the exposed areas 14a, 14b of the internal electrodes to the surfaces of the intermediate electrodes 7a, 7b.

In particular, in the surface mount coil component shown in FIG. 1, a drum type core is employed as the pillar-shaped core 21(1) (see also FIG. 2A), the internal electrodes 6a, 6b are provided directly on bottom surfaces 15a, 15b at both flanges 3a, 3b and the wraparound portions K extending from the bottom surfaces to the end surfaces 11a, 11b and parts of the both sides (12a, 12b, 13a, 13b in FIG. 2) respectively (see also FIG. 2B), ends 4a, 4b of coil conductor (coil winding) 4 wound around a winding core part 2 of the drum type core 21(1) are conductively joined to the internal electrodes 6a, 6b (see also FIG. 2C); intermediate electrodes 7a, 7b extending from top sides J of wraparound portions of the internal electrodes 6a, 6b to the sides 12a, 12b of the flanges 3a, 3b through top sides J of the wraparound portion of the internal electrodes 6a, 6b to the end surfaces 11a, 11b of the flanges 3a, 3b to the top sides J of the wraparound portion of the internal electrodes 6a, 6b to the other sides 1 3a, 13b of the flanges 3a, 3b for covering the internal electrodes 6a, 6b of the bottom surfaces 15a, 15b, exposed areas 14a, 14b on side surfaces of the internal electrodes being exposed from the intermediate electrodes 7a, 7b and having the substantially angular C-shape in cross section (see also FIG. 2E), and plating conductive films 9a, 9b continuing from surfaces of the exposed areas 14a, 14b of the internal electrodes to surfaces of the intermediate electrodes 7a, 7b are provided (see also FIG. 2F).

The substantially angular C-shape in cross section designates a shape of a section which appears when the internal electrode formed on the brim is cut along the direction of the thickness thereof. For example, in FIG. 1, it designates the shape of the cross-section which appears when the flanges are cut toward the mounting substrate 25 so that both of the internal electrodes 6a, 6b and the plating conductive films 9a, 9b serving as the external electrodes are cut, and the section has such a shape that the respective internal electrodes surround the three side surfaces of the flanges respectively, which corresponds to the substantially angular C-shape in cross section.

An exemplary process for manufacturing a certain embodiment is shown in FIG. 2 from (A) to (F). Various modifications to the process can be implemented to manufacture numerous other embodiments. The surface mount coil component described above, which enables direct mount of electrodes, may, for example, be obtained by (A) forming a compact by a method of spraying slurry containing nickel zinc system ferrite material powder of high resistivity, binder, and solvent, drying the same to granulate, and integrally molding the obtained granulation powder using a dry molding press into a drum type core 1 or by a method of obtaining a tabular ferrite compact according to the method described above, and forming the same into a drum type by grinding a drum type sintering ferrite core of by sintering and sintering the compact obtained by the method described above for two hours at 1050° C. The drum type core 1 obtained in this manner includes a winding core part 2 of a cylindrical form, flanges 3a, 3b of square shape in cross section formed integrally at both ends of the winding core part 2, and guide flutes M formed on four peripheral surfaces (bottom surfaces 15a, 15b, two side surfaces 12a, 12b, 13a, 13b, and top surfaces 16a, 16b). The above-described pillar-shaped core 21 employed in the invention may be formed not only of magnetic substance core such as, but not limited to, a ferrite core, but also of non-magnetic substance core such as alumina, resin, or other materials. (B) Subsequently, the internal electrodes 6a, 6b formed directly on the core may be, for example, formed in the areas including the guide flutes M on one peripheral surface which corresponds to the bottom surfaces out of four peripheral surfaces of the flanges 3a, 3b (since the surface mount coil component 10 is illustrated in a state of being inverted in the vertical direction, and hence the bottom surfaces 15a, 15b of the drum type core 1 come to the upper side) by a method of screen printing. A method of screen printing may include the steps of: using a screen mask having a desired opening pattern, holding the drum type core 1 on a printing stage, applying Ag electrode material paste containing Ag conductive powder, glass frit, and vehicle with a squeegee, and printing at 650° C. for 30 minutes. If desired, Ni plating and tin plating, or copper plating may be applied to the Ag printed electrode surface. The areas are as described above. (C) Subsequently, the coil conductor (winding coil) 4 is wound around the outer periphery of the winding core part 2 of the drum type core 1 by about ten turns, and both ends 4a, 4b thereof are conductively connected to positions on the guide flutes M of the internal electrodes 6a, 6b respectively by thermocompression bonding. The coil conductor 4 may be a polyurethane resin coating copper wire for example. (D) Then, cover resin with magnetic powder (cover resin) 5 is mounted to an area around the wire wound a portion of the coil conductor 4 wound around the winding core part 2 of the drum type core 1 interposed between the brim 3a and the brim 3b. The cover resin with magnetic powder (cover resin) 5 is preferably formed by filling coating material of cover resin 5 with magnetic powder containing 10 to 90 weight % of ferrite magnetic powder (for example, coating material obtained by blending epoxy resin and carboxyl group degeneration propylene glycol) by a dispenser, and allowing the same to stand and dry at a room temperature for 30 minutes. Alternatively, it may be formed by molding using a metal pattern. (E) Subsequently, the intermediate electrodes 7a, 7b are formed on the bottom surfaces 15a, 15b so as to embed conductive joints formed on the guide flutes M on the bottom surfaces of the flanges 3a, 3b. The areas are as described above. It is to be noted that the internal electrodes 6a, 6b formed on the end surfaces 11a, 11b of the flanges 3a, 3b and the wraparound portions of the side surfaces 12a, 12b, 13a, 13b sides includes the exposed areas 14a, 14b of the internal electrodes of substantially C-shape in cross section of about 30 to 600 μm in width, which is not covered by the intermediate electrodes 7a, 7b. (F) Then, the plating conductive films 9a, 9b are formed so as to continue from the surfaces of the exposed areas 14a, 14b of the internal electrodes to the surfaces of the intermediate electrodes 7a, 7b to complete the surface mount coil component 10. The plating conductive films 9a, 9b is preferably tin plating or nickel plating.

FIG. 3 is a cross-sectional view of the mounting substrate for the surface mount coil component according to an embodiment of the invention, illustrating a state in which the surface mount coil component 10 is mounted to the mounting substrate 25 in a normal method. The surface mount coil component 10 has a single-surface electrode structure in which the external electrodes (plating conductive films 9a, 9b), the intermediate electrodes 7a, 7b, and the internal electrodes 6a, 6b are formed substantially only on the bottom surfaces 15a, 15b of the flanges 3a, 3b to reduce the surface area thereof for improving the quality factor characteristics, and has the electrode structure in which the substantially C-shape in cross section on exposed areas 14a, 14b which are not covered by the intermediate electrodes 7a, 7b are provided on the internal electrodes 6a, 6b for the purpose of peel prevention of the electrode part at the time of substrate mounting, so that the plating conductive films 9a, 9b as the external electrodes and the internal electrodes 6a, 6b are firmly and closely adhered to each other at the interface thereof. Therefore, as will be understood from the cross-sectional view showing a state after the substrate mounting in FIG. 3, peeling off of the electrode part from the upper end of the solder fillets 23 due to the impact or the load is prevented.

In this regards, the coil component in JP-A-2000-306757 is only intended to improve the connection reliability, while the coil component in JP-A-58-124213 is only intended to improve the quality factor characteristics and has a problem in connection reliability since the cohesion power is poor. Therefore, neither of the technologies in JP-A-2000-306757 and JP-A-58-124213 complies with the improvement of both of the quality factor characteristics and the connection reliability. While the invention has an advantage such that the single-surface electrode can be effectively prevented from being peeled off the upper end of the solder fillets 23, since the substantially C-shaped cross section exposed areas 14a, 14b which provides the maximum cohesion strength is formed in the external electrodes 9a, 9b at positions at which the solder fillets 23 are formed when mounting because of the structure of the electrode part.

The surface mount coil component of the invention can be applied to various components, and is not specifically limited. For example, the invention can be applied to an inductor, a common mode choke coil, or the like.

What is claimed is:

1. A surface mount coil component comprising:
    internal electrodes each formed on a core near both ends thereof from bottom surfaces to wraparound portions which extend at least from the bottom surfaces to end surfaces and parts of both sides;
    intermediate electrodes extending from top sides of the wraparound portions of the internal electrodes on one side through the top sides of the wraparound portions of the internal electrodes on the end surfaces to the top sides of the wraparound portions of the internal electrodes on the other side and covering the internal electrodes of the bottom surfaces;
    wherein one or more areas of the internal electrodes are not covered by the intermediate electrodes, and wherein said one or more areas have a substantially C-shaped cross section; and
    conductive films covering the surfaces of the one or more areas of the internal electrodes not covered by the intermediate electrodes and the surfaces of the intermediate electrodes.

2. The surface mount coil component according to claim 1, wherein the core is pillar-shaped.

3. A surface mount coil component according to claim 1, wherein:
    the internal electrodes are mounted on bottom surfaces at both flanges of a drum type core and wraparound portions extending from the bottom surfaces to the end surfaces and parts of both sides;
    a coil conductor is wound around a winding core part of the drum type core, the coil conductor being conductively joined to the internal electrodes at the ends thereof;
    intermediate electrodes extend from top sides of wraparound portions of the internal electrodes to the sides of the flanges, to the end surfaces of the flanges, and to the other sides of the flanges and covering the internal electrodes of the bottom surfaces; and
    exposed areas on side surfaces of the internal electrodes extend from under the intermediate electrodes.

4. The surface mount coil component according to claim 1, wherein the conductive film comprises a plating film.

5. A surface mount coil component electronic device comprising:

a substrate; and a surface mount coil component disposed on the substrate, the surface mount coil component comprising:

internal electrodes each formed on a core near both ends thereof from bottom surfaces to wraparound portions which extend at least from the bottom surfaces to end surfaces and parts of both sides;

intermediate electrodes extending from top sides of the wraparound portions of the internal electrodes on one, side through the top sides of the wraparound portions of the internal electrodes on the end surfaces to the top sides of the wraparound portions of the internal electrodes on the other side and covering the internal electrodes of the bottom surfaces;

wherein one or more areas of the internal electrodes are not covered by the intermediate electrodes; and conductive films covering the surfaces of the one or more areas of the internal electrodes not covered by the intermediate electrodes and the surfaces of the intermediate electrodes.

6. The surface mount component electronic device according to claim 5, wherein the surface mount coil component comprises a pillar-shaped core.

7. The surface mount coil component electronic device according to claim 5, wherein the surface mount coil component comprises:

a drum type core;

internal electrodes mounted on bottom surfaces at both flanges of the drum type core and wraparound portions extending from the bottom surfaces to end surfaces and parts of both sides;

a coil conductor wound around a winding core part of the drum type core, the coil conductor being conductively joined to the internal electrodes at the ends of the coil conductor; and intermediate electrodes extending from top sides of the wraparound portions of the internal electrodes to the sides of the flanges, to the end surfaces of the flanges, and to the other sides of the flanges and covering the internal electrodes of the bottom surfaces.

8. The surface mount coil component electronic device according to claim 5, wherein the conductive film comprises a plating film.

* * * * *